United States Patent
Chen et al.

(10) Patent No.: US 9,047,205 B1
(45) Date of Patent: Jun. 2, 2015

(54) DATA STORAGE DEVICE EMPLOYING ORTHOGONAL EQUALIZATION AND SEQUENCE DETECTION TO COMPENSATE FOR TWO-DIMENSIONAL INTERSYMBOL INTERFERENCE

(71) Applicant: Western Digital Technologies, Inc., Irvine, CA (US)

(72) Inventors: Yiming Chen, Irvine, CA (US); Anantha Raman Krishnan, Irvine, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 107 days.

(21) Appl. No.: 13/968,323

(22) Filed: Aug. 15, 2013

(51) Int. Cl.
  *H03M 13/41* (2006.01)
  *G06F 11/10* (2006.01)
  *G06F 12/00* (2006.01)

(52) U.S. Cl.
  CPC ............... *G06F 11/10* (2013.01); *G06F 12/00* (2013.01); *H03M 13/41* (2013.01)

(58) Field of Classification Search
  CPC ............................. H03M 13/41; G06F 11/10
  See application file for complete search history.

(56) References Cited

U.S. PATENT DOCUMENTS

| | | | |
|---|---|---|---|
| 5,229,901 A | 7/1993 | Mallary | |
| 5,931,966 A * | 8/1999 | Carley | 714/795 |
| 5,956,195 A * | 9/1999 | Brickner et al. | 360/65 |
| 6,038,269 A * | 3/2000 | Raghavan | 375/340 |
| 6,154,335 A | 11/2000 | Smith et al. | |
| 6,157,510 A | 12/2000 | Schreck et al. | |
| 6,532,272 B1 * | 3/2003 | Ryan et al. | 375/348 |
| 6,690,739 B1 * | 2/2004 | Mui | 375/265 |
| 7,012,974 B1 * | 3/2006 | Liu et al. | 375/340 |
| 7,106,549 B2 | 9/2006 | Asakura | |
| 7,259,927 B2 | 8/2007 | Harris | |
| 7,978,797 B2 * | 7/2011 | Marrow | 375/346 |
| 8,139,301 B1 | 3/2012 | Li et al. | |
| 8,599,508 B1 | 12/2013 | Burd | |
| 8,797,666 B2 * | 8/2014 | Xia et al. | 360/39 |
| 8,850,276 B2 * | 9/2014 | Xu et al. | 714/701 |
| 2004/0006735 A1 * | 1/2004 | Mar et al. | 714/796 |
| 2005/0180039 A1 * | 8/2005 | Mayergoyz et al. | 360/46 |
| 2006/0015798 A1 * | 1/2006 | Coene et al. | 714/795 |
| 2007/0288825 A1 * | 12/2007 | Chung | 714/752 |
| 2008/0106816 A1 * | 5/2008 | Silvus | 360/51 |
| 2009/0052293 A1 * | 2/2009 | Conway et al. | 369/59.1 |

(Continued)

OTHER PUBLICATIONS

Sunho Kim; Woosik Moon; Sewhang Park; Sungbin Im, "A contraction mapping based two-dimensional equalizer and its application to holographic data storage systems," Digital Signal Processing and Signal Processing Education Meeting (DSP/SPE), 2013 IEEE , vol., no., pp. 86,89, Aug. 11-14, 2013.*

(Continued)

*Primary Examiner* — Steve Nguyen

(57) ABSTRACT

A data storage device is disclosed comprising a non-volatile memory (NVM), wherein data is read from the NVM to generate a two dimension matrix of signal samples, including a first dimension and a second dimension. The matrix of signal samples is first equalized to reduce intersymbol interference (ISI) in the first dimension to generate second dimension signal samples, and second equalized to reduce ISI in the second dimension to generate first dimension signal samples. A first data sequence is detected in response to the first dimension signal samples, and a second data sequence is detected in response to the second dimension signal samples.

20 Claims, 4 Drawing Sheets

(56) References Cited

U.S. PATENT DOCUMENTS

2012/0105994 A1    5/2012    Bellorado et al.
2013/0223199 A1    8/2013    Lund et al.

OTHER PUBLICATIONS

Nabavi, S.; Vijaya Kumar, B.V.K., "Two-Dimensional Generalized Partial Response Equalizer for Bit-Patterned Media," Communications, 2007. ICC '07. IEEE International Conference on, vol., no., pp. 6249,6254, Jun. 24-28, 2007.*

Kato, T.; Taira, S.; Maeda, T.; Katayama, Y.; Nishiya, T., "Two-dimensional run-length-limited code and partial response maximum likelihood system with multi-track recording," Optical Memory and Optical Data Storage Topical Meeting, 2002. International Symposium on, vol., no., pp. 51,53, 2002.*

Davey, P.J.; Donnelly, T.; Mapps, D.J.; Darragh, N., "Two-dimensional coding for a multi-track recording system to combat inter-track interference," Magnetics, IEEE Transactions on, vol. 34, No. 4, pp. 1949,1951, Jul. 1998.*

S. Nabavi, B. V. K. V. Kumar, "Two-Dimensional Generalized Partial Response Equalizer for Bit-Patterned Media," IEEE Trans. Magn., vol. 44, No. 11, pp. 3789-3792, Nov. 2008.

K. S. Chan, R. Radhakrishnan, K. Eason, R. M. Elidrissi1, J. Miles, B. Vasic and A. R. Krishnan, "Channel models and detectors for two-dimensional magnetic recording (TDMR)," IEEE Trans. Magn., vol. 46, No. 3, Mar. 2010.

Yunxiang Wu, Joseph A. O'Sullivan, Naveen Singla, and Ronald S. Indeck, "Iterative Detection and Decoding for Separable Two-Dimensional Intersymbol Interference," IEEE Transactions on Magnetics, vol. 39, No. 4, Jul. 2003.

\* cited by examiner

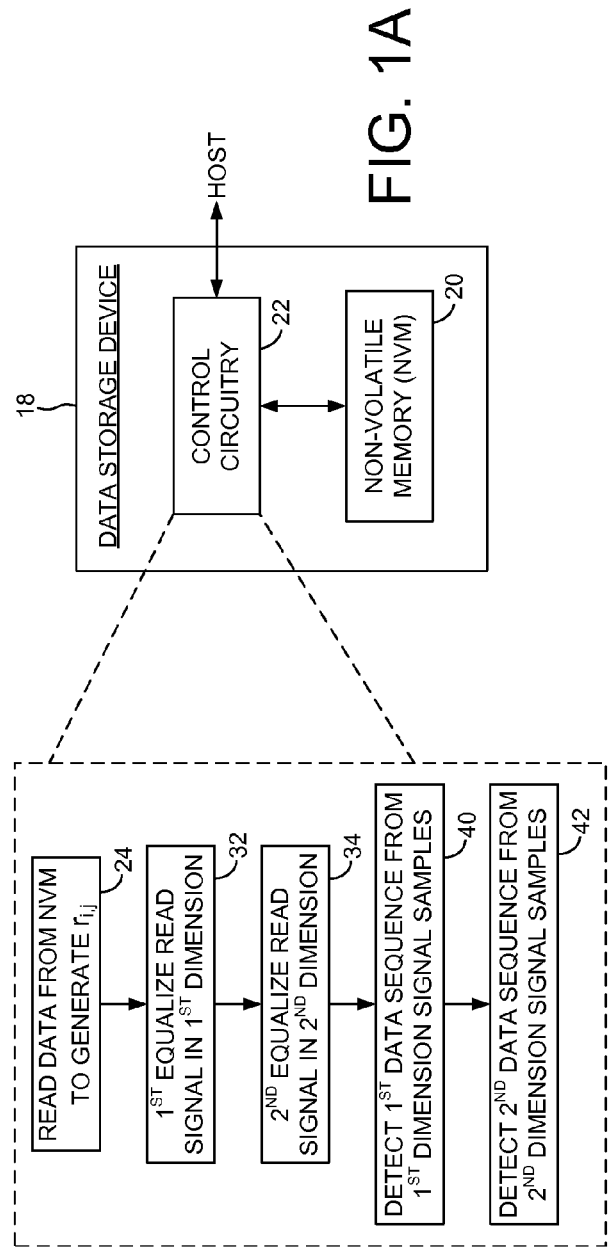
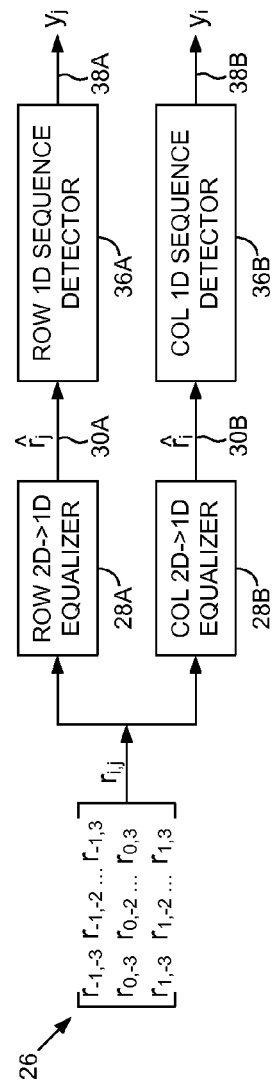

DATA STORAGE DEVICE EMPLOYING ORTHOGONAL EQUALIZATION AND SEQUENCE DETECTION TO COMPENSATE FOR TWO-DIMENSIONAL INTERSYMBOL INTERFERENCE

BACKGROUND

Data storage devices, such as disk drives, solid state drives and hybrid drives are employed in numerous areas such as computer systems (e.g., desktops, laptops, portables, etc.) and consumer devices (e.g., music players, cell phones, cameras, etc.). User data is typically stored in a non-volatile memory (NVM), such as a magnetic disk or a non-volatile semiconductor memory (e.g., Flash memory). Since the NVM is a noisy channel, the user data is typically encoded into codewords using any suitable coding technique which may include an iterative code (e.g., a Low Density Parity Check Code (LDPC)). The recorded codewords are read from the NVM and decoded so as to correct errors in the user data due to noise in the recording/reproduction process.

BRIEF DESCRIPTION OF THE DRAWINGS

FIG. 1A shows a data storage device comprising a non-volatile memory (NVM) and control circuitry according to an embodiment.

FIG. 1B is a flow diagram according to an embodiment wherein data is read from the NVM to generate a two dimension (2D) matrix of signal samples that are equalized in orthogonal directions and respective data sequences detected in each dimension.

FIG. 1C shows control circuitry according to an embodiment comprising row and column equalizers and row and column one-dimensional (1D) sequence detectors.

DETAILED DESCRIPTION

Figure 2A:
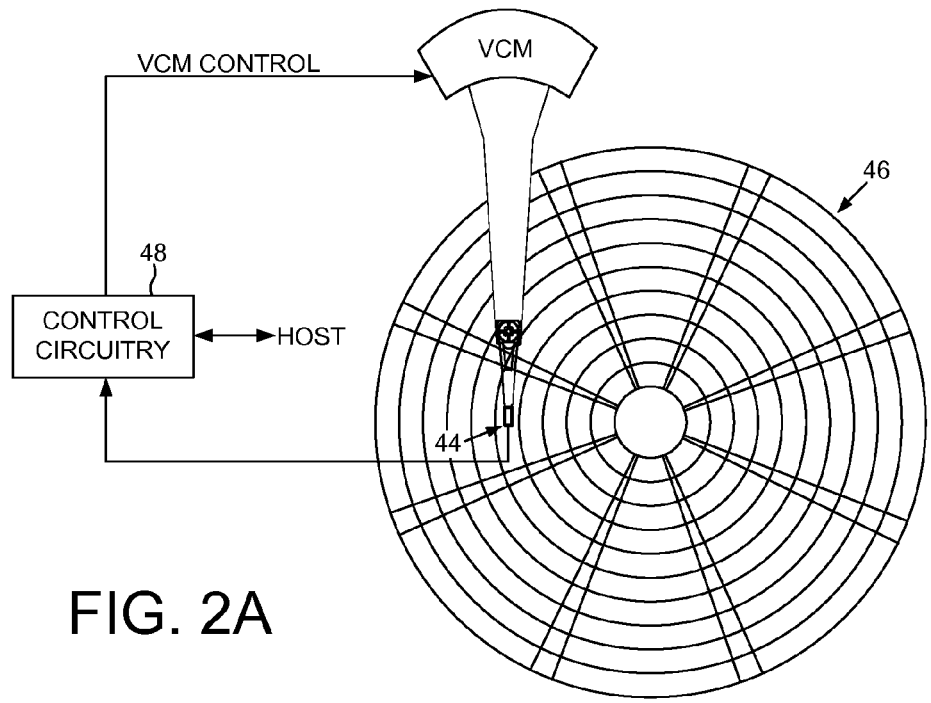
FIG. 2A shows an embodiment where the data storage device comprises a disk drive.

FIG. 1A shows a data storage device 18 according to an embodiment comprising a non-volatile memory (NVM) 20 and control circuitry 22 operable to execute the flow diagram of FIG. 1B wherein data is read from the NVM (block 24) to generate a two-dimension (2D) matrix of signal samples 26 (FIG. 1C), including a first dimension and a second dimension. A first equalizer 28A equalizes the matrix of signal samples 26 to reduce intersymbol interference (ISI) in the first dimension to generate second dimension signal samples 30A (block 32). A second equalizer 28B equalizes the matrix of signal samples 26 to reduce ISI in the second dimension to generate first dimension signal samples 30B (block 34). A first sequence detector 36A detects a first data sequence 38A in response to the first dimension signal samples 30A (block 40), and a second sequence detector 36B detects a second data sequence 38B in response to the second dimension signal samples 30B (block 42).

Any suitable data storage device 18 may be employed in the embodiments, and the data storage device 18 may comprise any suitable non-volatile memory 20. FIG. 2A shows a data storage device comprising a disk drive including a head 44 actuated over a disk 46 and control circuitry 48 for interfacing with a host. The disk 46 comprises a plurality of data tracks defined by servo sectors, wherein in one embodiment the first dimension in the matrix of signal samples 26 corresponds to signal samples of multiple data tracks across a radius of the disk 46, and the second dimension in the matrix of signal samples 26 corresponds to signal samples of a data track along a circumference of the disk 46.

Figure 2B:
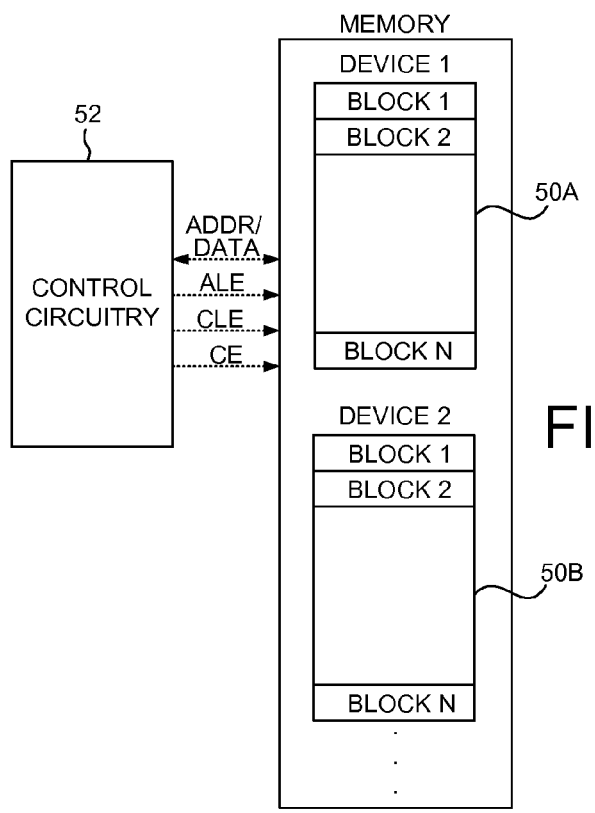
FIG. 2B shows an embodiment where the data storage device comprises a solid state drive.

FIG. 2B shows a data storage device comprising a solid state drive including a plurality of non-volatile semiconductor memories 50A, 50B, etc., such as flash memories, and control circuitry 52 for interfacing with a host. The non-volatile semiconductor memories may be accessed in rows of memory cells (pages), wherein the first dimension in the matrix of signal samples 26 corresponds to signal samples along a column of multiple rows, and the second dimension in the matrix of signal samples 26 corresponds to signal samples of a single row. A hybrid data storage device may also be employed comprising components of a disk drive shown in FIG. 2A combined with the non-volatile semiconductor memories shown in FIG. 2B, including the appropriate control circuitry for accessing the non-volatile semiconductor memories.

In order to increase the linear density of the recorded data, the data bits may be written using a controlled amount of ISI such as along the length of a data track in what is referred to as partial response (PR) recording. The linear ISI is then taken into account when demodulating the read signal, for example, using a trellis type sequence detector having a state transition diagram matched to the target partial response. The capacity of the NVM 20 may also be increased by recording the data with a higher row density (e.g., higher tracks per inch (TPI)). However, as the rows are spaced closer together in an effort to increase the capacity, an ISI may manifests across the rows in a column orientation. A trellis type sequence detector may be modified so as to account for both the row ISI and column ISI; however, the complexity of the corresponding state transition diagram increases exponentially with the number of rows affecting the column ISI.

In one embodiment, in order to simplify the complexity of the sequence detector, the two-dimension (2D) matrix of signal samples 26 shown in FIG. 1C is equalized so as to reduce the ISI in one dimension, followed by a one-dimensional (1D) sequence detector having a state transition diagram matched to the ISI in the second dimension. In the example of FIG. 1C, the 2D matrix of signal samples 26 comprises three samples in the column dimension corresponding to three rows of memory (e.g., data tracks) of column ISI, and seven samples in the row direction corresponding to seven bits of row ISI. A first 2D to 1D equalizer 28A reduces the ISI in the first dimension (column) to generate second dimension (row) signal samples 30A. A first 1D sequence detector 36A then detects a first data sequence 38A in response to the row signal samples 30A. A second 2D to 1D equalizer 28B reduces the ISI in the second dimension (row) to generate first dimension (column) signal samples 30B. A second 1D sequence detector 36B detects a second data sequence 38B in response to the column signal samples 30B.

The complexity of implementing two 1D sequence detectors as shown in FIG. 1C is significantly less than the complexity of a 2D sequence detector.

Figure 3A:
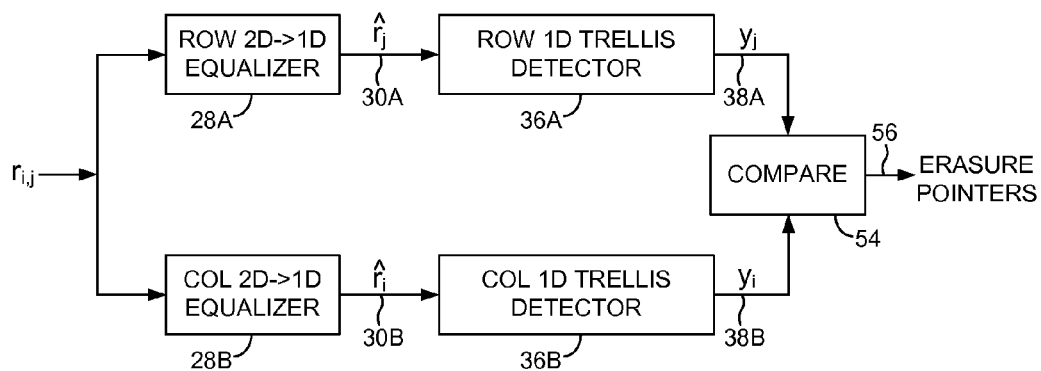
FIG. 3A shows an embodiment wherein the data sequences generated by the sequence detectors are compared to generate erasure pointers.

The first data sequence 38A generated by the first sequence detector 36A and the second data sequence 38B generated by the second sequence detector 36B may be used to enhance the data demodulation accuracy in any suitable manner. FIG. 3A shows an embodiment wherein the first data sequence 38A is compared 54 to the second data sequence 38B to generate erasure pointers 56, wherein each erasure pointer corresponds to a mismatch between the data sequences. The erasure pointers 56 may then be processed to correct the errors that caused the mismatches, for example, by using the erasure pointers 56 to enhance an iterative sequence detection algorithm, or using the erasure pointers 56 to enhance the decoding of an error correction code (ECC).

Figure 3B:
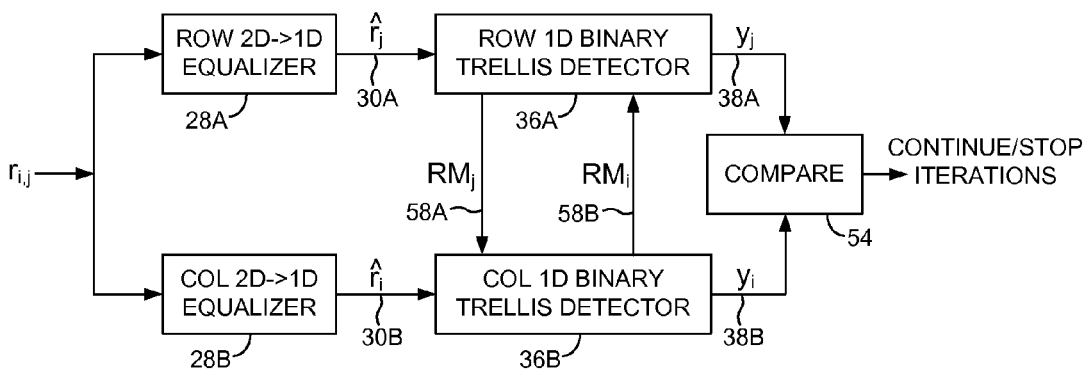
FIG. 3B shows an embodiment wherein each sequence detector generates reliability metrics that are passed between the sequence detectors to improve performance.

FIG. 3B shows an embodiment wherein the first sequence detector 36A generates a first reliability metric 58A (e.g., a log-likelihood ratio (LLR)) for each symbol in the first detected data sequence 38A. An example sequence detector that generates reliability metrics is a soft-output Viterbi algorithm (SOVA). The first reliability metrics 58A are processed by the second sequence detector 36B in order to improve the accuracy of the second data sequence 38B. Similarly, the second sequence detector 36B may generate a second reliability metric 58B (e.g., a log-likelihood ratio (LLR)) for each symbol in the second detected data sequence 38B. The second reliability metrics 58B may be processed by the first sequence detector 36A in order to improve the accuracy of the first data sequence 38A. In this embodiment, each sequence detector processes the respective equalized signal samples as well as the reliability metrics generated by the other sequence detector. In one embodiment, each sequence detector in FIG. 3B comprises a binary trellis sequence detector which compensates for ISI in one dimension as compared to a non-binary trellis sequence detector which compensates for ISI in multiple dimensions.

In one embodiment, both sequence detectors in FIG. 3B may operate concurrently during each iteration in order to concurrently generate the first and second data sequences using the reliability metrics 58A and 58B generated during the previous iteration. In another embodiment, the sequence detectors in FIG. 3B may operate sequentially, such as by detecting the first data sequence 36A and generating corresponding reliability metrics 58A during a first iteration which are then processed during a following iteration by the second sequence detector 36B to detect the second data sequence 36B and generating corresponding reliability metrics 58B that are passed to the first sequence detector 36A for the next iteration.

In the embodiment shown in FIG. 3B, the sequence detectors may iterate on the signal samples and the reliability metrics until any suitable criterion is satisfied, such as when the comparator 54 indicates that the first data sequence 38A matches the second data sequence 38B. In another embodiment, the iterations may continue until the reliability metrics indicate a high degree of reliability for at least one of the data sequences, or until a maximum number of iterations is reached.

Figure 4:
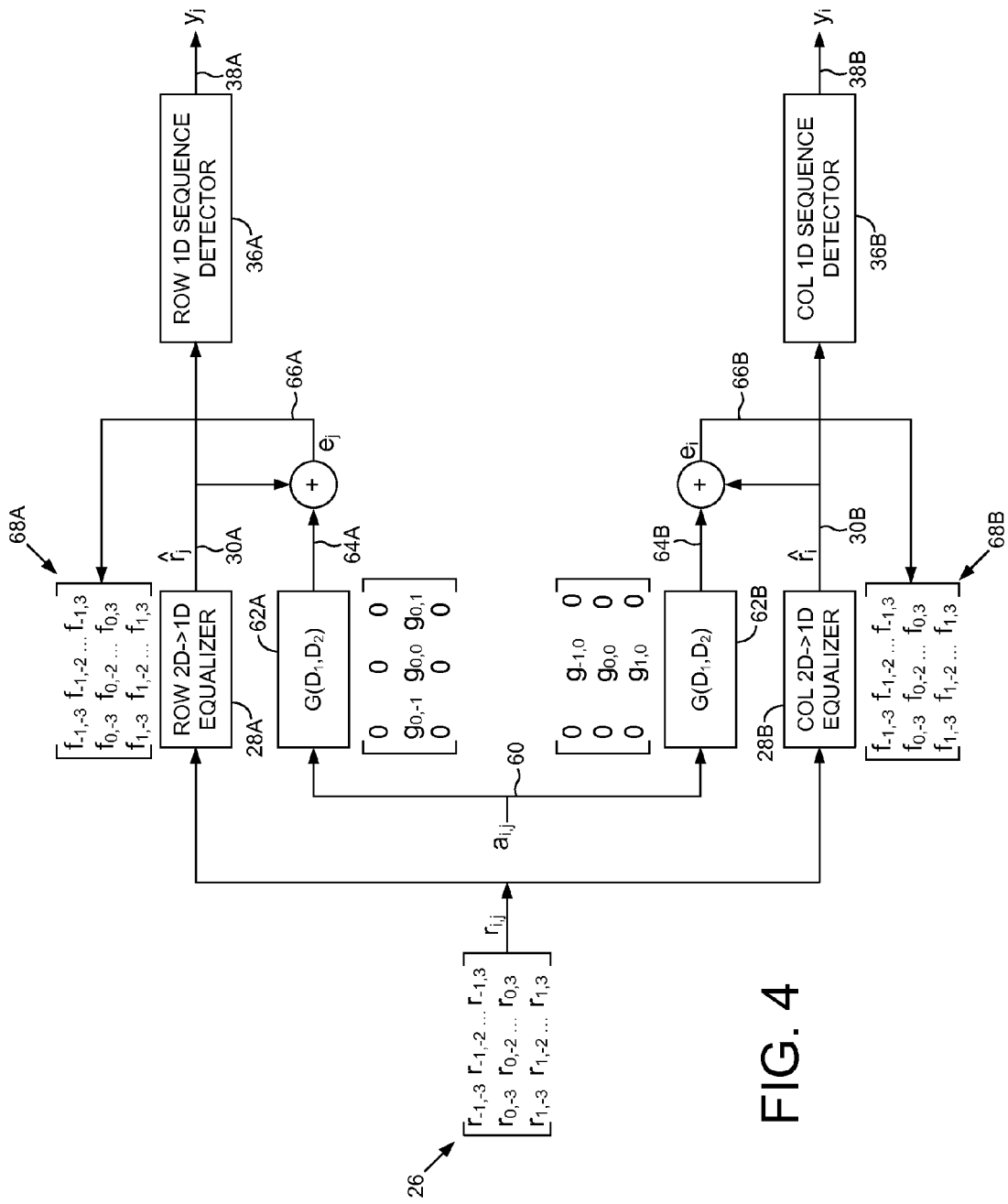
FIG. 4 shows an embodiment wherein coefficients of the 2D to 1D equalizers are adapted based on a target response for the respective 1D sequence detector during a calibration procedure.

The first and second equalizers 28A and 28B in the embodiment of FIG. 1C may be implemented in any suitable manner in order to reduce the ISI in the respective dimensions. FIG. 4 shows an embodiment for adapting coefficients of each 2D to 1D equalizer 28A and 28B based on a target response for the respective 1D sequence detector during a calibration procedure. Further details regarding this embodiment are disclosed in the technical paper by S. Nabavi and B. V. K. Vijaya Kumar, "Two-Dimensional Generalized Partial Response Equalizer for Bit-Patterned Media," in *Proc. ICC 2007*, pp. 6249-6254, 2007, Section IV of which is incorporated herein by reference. In this embodiment, the technique disclosed in the above paper is used to adapt the coefficients of each 2D to 1D equalizer 28A and 28B for the corresponding orthogonal dimensions.

During a calibration procedure, a test pattern 60 is written to multiple rows of the NVM 20 such as by writing data to multiple consecutive data tracks in a disk drive (e.g., three data tracks) which are then read to generate the two-dimensional matrix of signal samples 26 shown in FIG. 4. The test pattern 60 is also filtered by a first matrix 62A representing the target response for the first sequence detector 36A to generate expected signal samples 64A in the row dimension. A first error sequence 66A is generated as the difference between the expected signal samples 64A and the row dimension signal samples 30A output by the first equalizer 28A. The first error sequence 66A is then used to adapt a first matrix of coefficients 68A for the first equalizer 28A in a manner that minimizes the error sequence 66A. Similarly, the test pattern 60 is filtered by a second matrix 62B representing the target response for the second sequence detector 36B to generate expected signal samples 64B in the column dimension. A second error sequence 66B is generated as the difference between the expected signal samples 64B and the column dimension signal samples 30B output by the second equalizer 28B. The second error sequence 66B is then used to adapt a second matrix of coefficients 68B for the second equalizer 28B in a manner that minimizes the error sequence 66B. In another embodiment, both the coefficient matrix for the equalizer and the target response matrix for the sequence detectors may be adapted in a manner that minimizes the first and second error sequences 66A and 66B. In this embodiment, the trellis of each 1D sequence detector 36A and 36B is then matched to the respective adapted matrix representing the respective target response.

The 2D matrix of signal samples 26 shown in FIG. 1C may be generated in any suitable manner within a disk drive data storage device shown in FIG. 2A. In one embodiment, the head 44 may comprise a single read element capable of reading a single data track during a first revolution of the disk 46. In this embodiment, the head 44 may be positioned over an adjacent data track during a next revolution of the disk 46 and the signal samples buffered while reading the next data track. This process may then be repeated until a sufficient number of signal samples have been buffered to generate the 2D matrix of signal samples 26. In the example of FIG. 1C, the signal samples for at least part of three consecutive data tracks are buffered and then processed as a matrix of signal samples 26 that slides along the buffered samples in the linear direction. As each new consecutive data track is read, the signal samples are buffered and the matrix of signal samples shifted in the radial direction. This embodiment may be employed, for example, in a log structured disk drive where data is always written to consecutive data tracks and may be shingled to further increase the radial density. When writing/reading sequential data sectors (e.g., in a streaming environment), the matrix of signal samples 26 may be generated naturally as the head seeks from track to track.

In another embodiment, the head 44 of a disk drive may comprise multiple read elements (e.g., three read elements) capable of concurrently reading multiple data tracks. In this embodiment, all or part of the matrix of signal samples 26 shown in FIG. 1C may be generated while concurrently reading the multiple data tracks during a single revolution of the disk. Although the matrix of signal samples 26 shown in FIG.

1C corresponds to seven bits of row ISI and three tracks of column ISI, the matrix may comprise any suitable number of elements corresponding to any suitable number of bits of row ISI and any suitable number of tracks of column ISI (or any suitable number of rows and columns of a non-volatile semiconductor memory in the embodiment of FIG. 2B).

Any suitable control circuitry may be employed to implement the flow diagrams in the above embodiments, such as any suitable integrated circuit or circuits. For example, when the data storage device comprises a disk drive as shown in FIG. 2A, the control circuitry may be implemented within a read channel integrated circuit, or in a component separate from the read channel, such as a disk controller, or certain operations described above may be performed by a read channel and others by a disk controller. In one embodiment, the read channel and disk controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or disk controller circuit, or integrated into a SOC.

In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored in a non-volatile memory and read into a volatile semiconductor memory when the data storage device is powered on. In yet another embodiment, the control circuitry may comprise suitable logic circuitry, such as state machine circuitry.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. A data storage device comprising:
a non-volatile memory (NVM); and
control circuitry operable to:
    read data from the NVM to generate a two dimension matrix of signal samples, including a first dimension and a second dimension;
    first equalize the matrix of signal samples to reduce intersymbol interference (ISI) in the first dimension to generate second dimension signal samples;
    second equalize the matrix of signal samples to reduce ISI in the second dimension to generate first dimension signal samples;
    first detect a first data sequence in response to the first dimension signal samples;
    second detect a second data sequence in response to the second dimension signal samples;
wherein the control circuitry is further operable to:
    compare the first data sequence to the second data sequence;
    generate at least one erasure pointer corresponding to when the first data sequence does not match the second data sequence; and
    process the at least one erasure pointer to correct at least one error in at least one of the first data sequence and the second data sequence.

2. The data storage device as recited in claim 1, wherein the control circuitry is further operable to:
    generate first reliability metrics when detecting the first data sequence; and
    process the first reliability metrics when second detecting the second data sequence.

3. The data storage device as recited in claim 2, wherein the control circuitry is further operable to:
    generate second reliability metrics when detecting the second data sequence; and
    process the second reliability metrics when first detecting the first data sequence.

4. The data storage device as recited in claim 3, wherein the control circuitry is further operable to iterate the first detecting and the second detecting at least once.

5. The data storage device as recited in claim 4, wherein the control circuitry is further operable to iterate the first detecting and the second detecting until the first data sequence matches the second data sequence.

6. The data storage device as recited in claim 2, wherein the control circuitry is operable to second detect the second data sequence using a binary trellis sequence detector.

7. The data storage device as recited in claim 3, wherein the control circuitry is operable to first detect the first data sequence using a first binary trellis sequence detector and second detect the second data sequence using a second binary trellis sequence detector.

8. The data storage device as recited in claim 1, wherein the NVM comprises a non-volatile semiconductor memory.

9. The data storage device as recited in claim 1, wherein the NVM comprises a disk of a disk drive.

10. The data storage device as recited in claim 9, wherein:
    the disk comprises a plurality of data tracks;
    the first dimension corresponds to signal samples of multiple data tracks across a radius of the disk; and
    the second dimension corresponds to signal samples of a data track along a circumference of the disk.

11. A method of operating a data storage device comprising a non-volatile memory (NVM), the method comprising:
- reading data from the NVM to generate a two dimension matrix of signal samples, including a first dimension and a second dimension;
- first equalizing the matrix of signal samples to reduce intersymbol interference (ISI) in the first dimension to generate second dimension signal samples;
- second equalizing the matrix of signal samples to reduce ISI in the second dimension to generate first dimension signal samples;
- first detecting a first data sequence in response to the first dimension signal samples;
- second detecting a second data sequence in response to the second dimension signal samples;
- comparing the first data sequence to the second data sequence;
- generating at least one erasure pointer corresponding to when the first data sequence does not match the second data sequence; and
- processing the at least one erasure pointer to correct at least one error in at least one of the first data sequence and the second data sequence.

12. The method as recited in claim 11, further comprising:
- generating first reliability metrics when detecting the first data sequence; and
- processing the first reliability metrics when second detecting the second data sequence.

13. The method as recited in claim 12, further comprising:
- generating second reliability metrics when detecting the second data sequence; and
- processing the second reliability metrics when first detecting the first data sequence.

14. The method as recited in claim 13, further comprising iterating the first detecting and the second detecting at least once.

15. The method as recited in claim 14, further comprising iterating the first detecting and the second detecting until the first data sequence matches the second data sequence.

16. The method as recited in claim 12, further comprising second detecting the second data sequence using a binary trellis sequence detector.

17. The method as recited in claim 13, further comprising first detecting the first data sequence using a first binary trellis sequence detector and second detecting the second data sequence using a second binary trellis sequence detector.

18. The method as recited in claim 11, wherein the NVM comprises a non-volatile semiconductor memory.

19. The method as recited in claim 11, wherein the NVM comprises a disk of a disk drive.

20. The method as recited in claim 19, wherein:
- the disk comprises a plurality of data tracks;
- the first dimension corresponds to signal samples of multiple data tracks across a radius of the disk; and
- the second dimension corresponds to signal samples of a data track along a circumference of the disk.

* * * * *